(12) United States Patent
Shinohara

(10) Patent No.: US 7,476,966 B2
(45) Date of Patent: Jan. 13, 2009

(54) SEMICONDUCTOR MODULE

(75) Inventor: Toshiaki Shinohara, Tokyo (JP)

(73) Assignee: Mitsubushi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/337,465

(22) Filed: Jan. 24, 2006

(65) Prior Publication Data

US 2006/0202323 A1    Sep. 14, 2006

(30) Foreign Application Priority Data

Mar. 9, 2005    (JP) .............................. 2005-065471

(51) Int. Cl.
*H01L 23/10*    (2006.01)

(52) U.S. Cl. ........................ 257/706; 257/666; 257/696; 257/E23.014

(58) Field of Classification Search ................ 257/696, 257/706, E23.014, 690, 692, 704, 712, 713, 257/787–796, 687, 698, 700, 701
See application file for complete search history.

(56) References Cited

U.S. PATENT DOCUMENTS

| | | | | |
|---|---|---|---|---|
| 4,698,660 A | * | 10/1987 | Kubota et al. ................ | 257/696 |
| 5,160,270 A | * | 11/1992 | Reymond .................... | 439/70 |
| 5,517,058 A | * | 5/1996 | Temple ........................ | 257/692 |
| 5,539,253 A | * | 7/1996 | Nagaune ...................... | 257/687 |
| 5,825,085 A | | 10/1998 | Masumoto et al. | |
| 6,034,421 A | * | 3/2000 | Tokunaga .................... | 257/666 |
| 6,337,796 B2 | * | 1/2002 | Yamada et al. .............. | 361/719 |
| 2001/0042638 A1 | | 11/2001 | Yamada et al. | |
| 2004/0207053 A1 | | 10/2004 | Yamashita et al. | |
| 2005/0135065 A1 | * | 6/2005 | Nakatsu et al. ............. | 361/703 |

FOREIGN PATENT DOCUMENTS

| | | |
|---|---|---|
| JP | 62-130547 | 6/1987 |
| JP | 9-213878 | 8/1997 |
| JP | 2003-303939 | 10/2003 |

* cited by examiner

*Primary Examiner*—Lynne Gurley
*Assistant Examiner*—Kathreen A Woyak
(74) *Attorney, Agent, or Firm*—Oblon, Spivak, McClelland, Maier & Neustadt, P.C.

(57) ABSTRACT

One of the aspects of the present invention is to provide a semiconductor module, which includes at least one semiconductor device including a semiconductor element molded with a resin package having a main surface and a side surface, and a plurality of terminals extending from the side surface and being bent towards a direction away from the main surface. It also includes a box-shaped hollow casing including a base member having a plurality of through-holes and an opening opposing to the base member, for receiving the semiconductor device with the terminals of the semiconductor device inserted into the through-holes. Further, the semiconductor module includes an insulating resin member filling up a gap defined between the semiconductor device and the casing so as to cover portions of the terminals at the side surface of the resin package of the semiconductor device.

11 Claims, 4 Drawing Sheets

SEMICONDUCTOR MODULE

BACKGROUND OF THE INVENTION

1) Technical field of the Invention

The present invention relates to a semiconductor module, and in particular, relates to the semiconductor module including a semiconductor device with a main surface contacted onto a radiator of grand potential.

2) Description of Related Arts

The conventional semiconductor device includes a semiconductor chip molded with packaging resin may be used with the radiator contacted thereon for radiating heat generated by the semiconductor chip. Also, the radiator may be connected with the grand potential in accordance with the type of the semiconductor device during operation of the semiconductor device. In this circumstance, especially in case where the power semiconductor device having high withstand voltage such as 600 volts and 1200 volts is demanded, adequate insulating clearance distance and insulating creepage distance should be secured between the terminals of the semiconductor device and the radiator connected with the grand potential.

One of the conventional techniques, i.e., JPA 2003-303939, discloses a power semiconductor module which secures adequate insulating clearance distance and insulating creepage distance required between the adjacent terminals by means of projected walls of resin and grooves formed continuously with the walls.

However, the semiconductor module is assembled with any existing semiconductor devices, thus ones having fixed outline, it is difficult to form such walls and grooves on the semiconductor device. In particular, in case where the semiconductor device is one of DIP-type (Dual Inline Package) semiconductor devices, which includes the semiconductor chip molded with the resin package having a main surface contacting the radiator, and a plurality of terminals (lead frames) extending from side surfaces and being bent towards the direction away from the main surface, the distance between the terminals and the radiator of the grand potential may be closer than that of the other type of the semiconductor devices. Therefore, securing sufficient insulating clearance distance and insulating creepage distance of the semiconductor module using the DIP-type semiconductor devices is one of major issues.

Therefore, one of the aspects of the present invention has a purpose to provide the semiconductor module composed of the semiconductor device, which includes the semiconductor element molded with the resin package having the main surface contacting the radiator, and a plurality of terminals (lead frames) extending from side surfaces and being bent towards the direction away from the main surface, in which adequate insulating clearance distance and insulating creepage distance are secured even when the semiconductor module is fixed onto the radiator.

SUMMARY OF THE INVENTION

Further scope of applicability of the present invention will become apparent from the detailed description given hereinafter. However, it should be understood that the detailed description and specific examples, while indicating preferred embodiments of the invention, are given by way of illustration only, since various changes and modifications within the sprit and scope of the invention will become apparent to those skilled in the art from this detailed description.

According to one of the aspects of the present invention, a semiconductor module is provided, which includes at least one semiconductor device including a semiconductor element molded with a resin package having a main surface and a side surface, and a plurality of terminals extending from the side surface and being bent towards a direction away from the main surface. It also includes a box-shaped hollow casing including a base member having a plurality of through-holes and an opening opposing to the base member, for receiving the semiconductor device with the terminals of the semiconductor device inserted into the through-holes. Further, the semiconductor module includes an insulating resin member filling up a gap defined between the semiconductor device and the casing so as to cover portions of the terminals at the side surface of the resin package of the semiconductor device.

BRIEF DESCRIPTION OF THE DRAWINGS

The present invention will more fully be understood from the detailed description given hereinafter and accompanying drawings which are given by way of illustration only, and thus are not limitative of the present invention.

DETAILED DESCRIPTION OF THE PREFERRED EMBODIMENTS

Referring to the attached drawings, the details of embodiments according to the present invention will be described hereinafter. In those descriptions, although the terminology indicating the directions (for example, "upper" and "lower") are conveniently used just for clear understandings, it should not be interpreted that those terminology limit the scope of the present invention.

Embodiment 1

Figure 1:
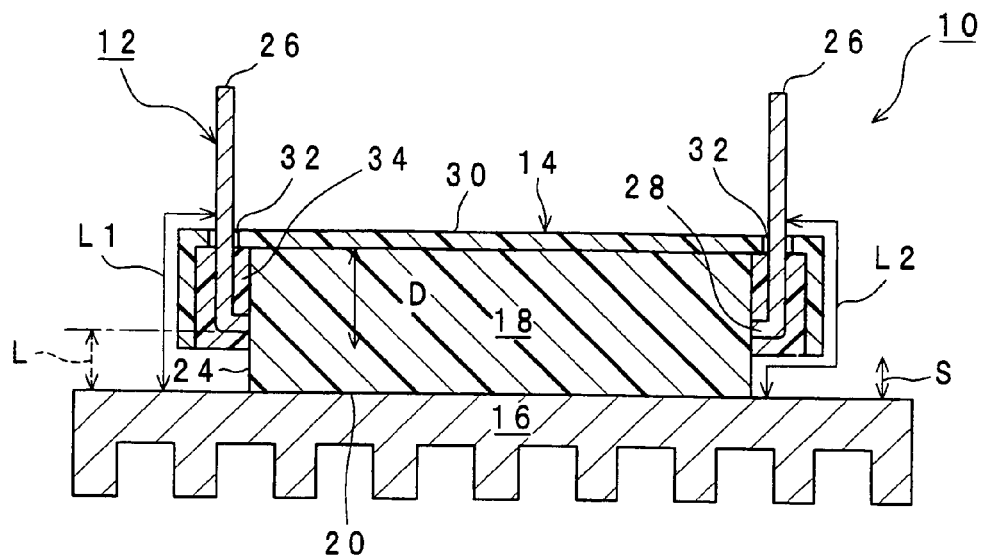
FIG. 1 is a cross sectional view of the semiconductor module according to the first embodiment of the present invention.

FIG. 1 is a schematic cross sectional view illustrating a semiconductor module according to the first embodiment of the present invention, which is entirely denoted as reference numeral 100, eliminating the details inside a semiconductor device. As shown in FIG. 1, the semiconductor module 10 includes, in general, a power semiconductor device 12 and a hollow box-shaped casing 14 having a lower wide opening for receiving the semiconductor device 12. The semiconductor device 12 includes a semiconductor element or chip (not shown) molded or encapsulated with a resin package 18 that has a main surface 20 and side surfaces 24. Also, when the semiconductor module 10 is assembled, the main surface 20 of the package 18 is fixed onto a radiator of grand potential for receiving and radiating heat from the semiconductor device 12.

Further, the semiconductor device 12 includes a plurality of terminals (lead frames) 26 extending from the side surfaces 24 of the package 18 and being bent towards the direction away from the main surface 20 or the radiator 16, e.g., being bent upwardly. The DIP-type semiconductor device has such a structure as described above.

The casing 14 is made of resin such as PPS (poly-phenylene sulfide), PBT (poly-butylene terephthalate), and PET (poly-ethylene terephthalate). Also, as above, the casing 14 has a hollow box-shaped and a wide opening for receiving at least a portion of the semiconductor device 12. Thus, when viewing from the directions perpendicular to the side surfaces 24 of the package 18, the received portion of the semiconductor device 12 is overlapped and invisible by the casing 14. The casing 14 has depth D designed so that root portions 28 of the terminals 26 are fully received and overlapped.

The casing 14 includes a plurality of through-holes 32 formed on the base member 30 (which may also be referred to as a bottom member) at positions corresponding to those of the terminals 26 of the semiconductor device 12, allowing the semiconductor device 12 to be received within the package 18.

Also, the casing 14 is designed to define a gap between the side surfaces 24 of the semiconductor device 12 and the casing 14, in which insulating resin material such as epoxy resin is filled up. When, in a condition upside down of FIG. 1, i.e., the semiconductor device 12 and the casing 14 are arranged with the opening facing upwardly and the base member 30 of the casing 14 facing downwardly, the gap is filled up with the insulating resin material, which preferably has high flowability before hardening so that every detail portion in the gap is filled up with the insulating resin. This forms an insulating resin member 34 in the gap. Preferably, the insulating resin is hardened in a simple step.

A portion of the terminal 26 is covered with the casing 14 and the insulating resin member 34, and exposed to the ambient atmosphere is only the remaining portion of the terminal extending from the through-hole 32 of the casing 14 to the tip thereof. Therefore, according to the present embodiment, the shortest spatial distance between the terminal 26 and the radiator 16 (referred to as insulating clearance distance) is defined as L1, and the shortest surficial distance between the terminal 26 and the radiator 16 (referred to as insulating creepage distance) is set as L2, which are fairly longer than those in case where the casing 14 and the insulating resin member 34 are not provided, as indicated by a dotted line L. Therefore, the withstand voltage of the semiconductor module 10 is substantially improved.

Embodiment 2

Figure 2:
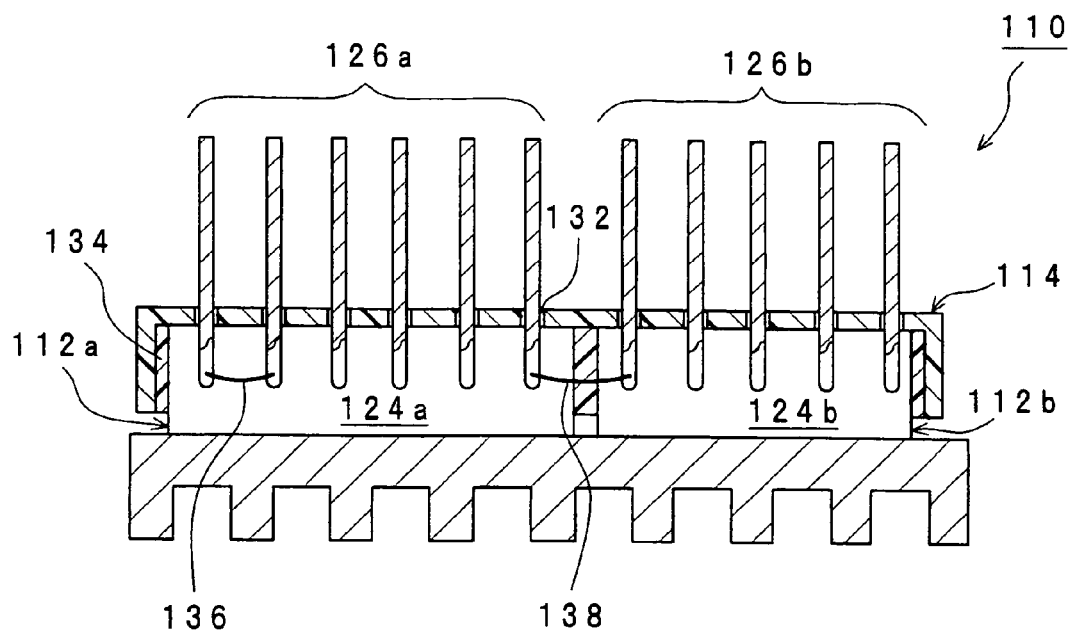
FIG. 2 is a cross sectional view of the semiconductor module according to the second embodiment of the present invention.

FIG. 2 is a schematic cross sectional view of a semiconductor module, taken along a plane parallel to the side surface of the semiconductor device, according to the second embodiment of the present invention. The semiconductor module 110 of the second embodiment has a structure similar to that of the first embodiment except that a plurality of semiconductor devices 124a, 124b is received in the casing 114. Further description will be made focusing on the components different from ones of the first embodiment.

The semiconductor module 110 includes the casing 114 that receives two of the semiconductor devices 112a, 112b.

Also, it has a plurality of through-holes 132 for insertion of the terminals 126a, 126b of the semiconductor devices 112a, 112b.

An advantage for incorporating two of semiconductor devices into one semiconductor module will be described herein. In the typical semiconductor device incorporating two different functional circuitries, if one of the functional circuitries fails, the semiconductor device is totally defective regardless whether another one of the functional circuitries is good, thereby wasting the non-defective one of the functional circuitries. Contrary, instead of one semiconductor device integrating a plurality of functional circuitries, the semiconductor module may include, for example, a first semiconductor device having the first functional circuitry and a second semiconductor device having the second functional circuitry of which process yield is less (i.e., defective fraction is greater) than that of the first semiconductor device. Only the non-defective second semiconductor device having the poor process yield is used to assemble the semiconductor module, thereby to avoid wasting the non-defective first semiconductor device. Therefore, the process yield of the semiconductor module having multiple functions can be improved in comparison with that of the semiconductor device serving multiple functions same as those of the semiconductor module.

Also, as shown in FIG. 2, two of the terminals 126a of the semiconductor device 112a may electrically be connected to each other via the wire (conductive connector) 136 formed within the insulating resin member 134. Also, ones of the terminals 126a, 126b of those semiconductor devices 112a, 112b are connected to each other via the wire 138 formed within the insulating resin member 134. This eliminates electrical connection outside the semiconductor module 110, so that the end-user of the semiconductor module 110 of the present embodiment does not have to connect those terminals.

Embodiment 3

Figure 3:
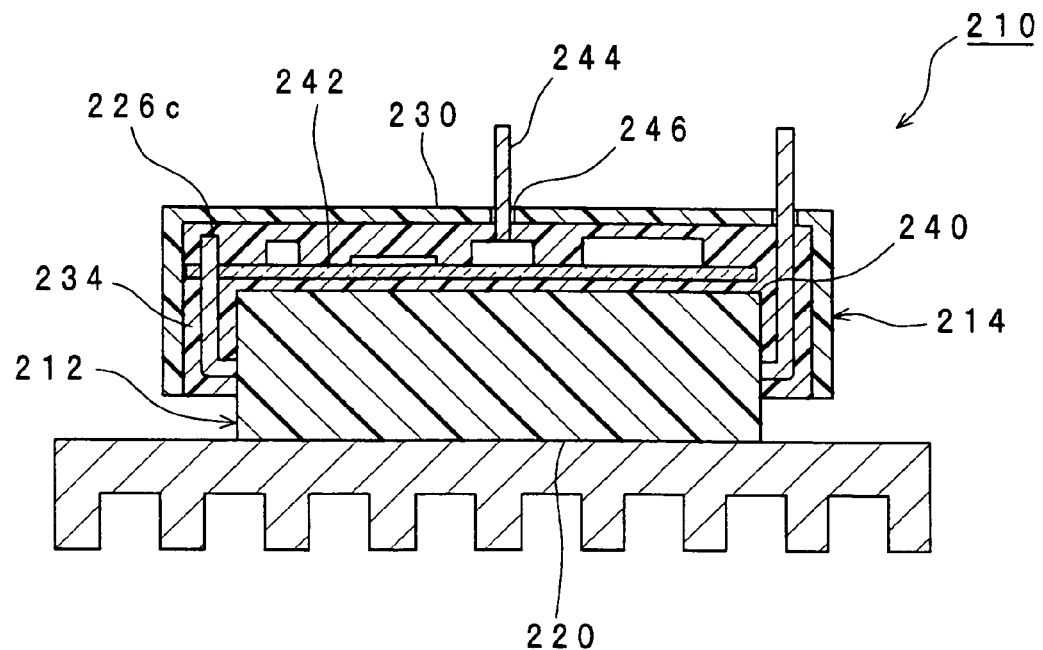
FIG. 3 is a cross sectional view of the semiconductor module according to the third embodiment of the present invention.

FIG. 3 is a schematic cross sectional view of a semiconductor module according to the third embodiment of the present invention. The semiconductor module 210 of the third embodiment has a structure similar to those of the above-described embodiments except that a circuit board is received between the semiconductor devices 212 and the casing 214. Further description will be made focusing on the components different from ones of the aforementioned embodiments.

As above, the semiconductor module 210 of the present embodiment receives the circuit board 242 provided between the intermediate (upper) surface of the semiconductor device 212 opposing to the main surface 220 and the base member 230 of the casing 214, and the circuit board 242 is electrically connected with the semiconductor device 212 via the terminals 226c.

Also, the semiconductor module 210 includes an external terminal 244 for electrical connection of the circuit board 242 with an external circuitry (not shown). Also, the casing 214 includes another through-hole 246 for insertion of the external terminal 244.

According to the present embodiment, the circuit board 242 electrically connected with the semiconductor device 212 is protected by the insulating resin member 234.

Embodiment 4

Figure 4:
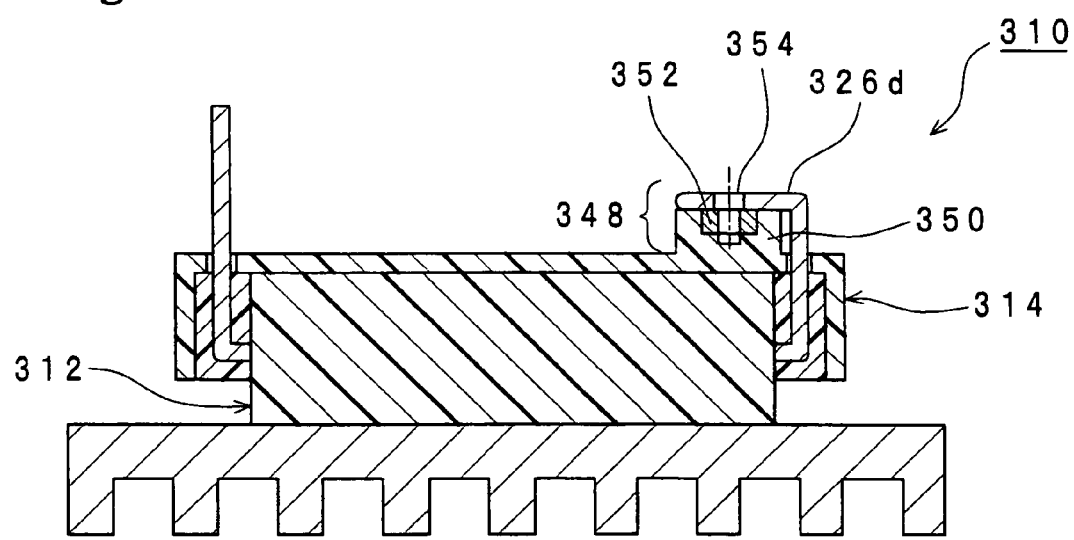
FIG. 4 is a cross sectional view of the semiconductor module according to the fourth embodiment of the present invention.

FIG. 4 is a schematic cross sectional view of a semiconductor module according to the fourth embodiment of the present invention. The semiconductor module 310 of the forth embodiment has a structure similar to those of the above-described embodiments except that a terminal block 348 is provided on the casing 314. Further description will be made focusing on the components different from ones of the aforementioned embodiments.

As above, the semiconductor module 310 of the present embodiment includes the terminal block 348 composed of a terminal-block base 350 of the casing 314 in conjunction with the terminal 326d of the semiconductor device 312. The terminal-block base 350 includes a built-in nut 352, while the terminal 326d has a hole 354 for insertion of a screw to be fastened with the nut 352. The terminal 326d is bent so that the nut 352 and the hole 354 are arranged coaxially and the terminal 326d is supported on the terminal-block base 350. This structure facilitates fastening the bus-bar on and detaching it from the terminal block 348.

Various features of the present invention have been described above with four embodiments of the semiconductor modules, each of which can be combined with other features and does not always have to be implemented independently. For instance, the semiconductor module may include a plurality of the semiconductor devices, the circuit board between the base member of the casing and the semiconductor devices, and the terminal block. Also, a person skilled in the art would conceive other changes and modifications without departing from the scope and the sprit of the present invention that is to secure the adequate insulating clearance distance and insulating creepage distance.

Figure 5:
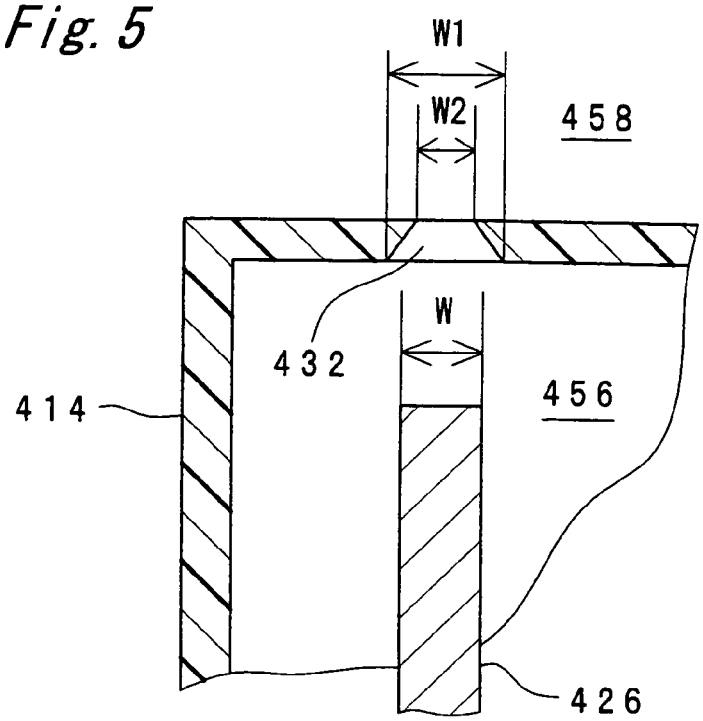
FIG. 5 is an enlarged cross sectional view of the improved through-hole formed on the casing.

Also, for example, the through-hole may be formed so that the outer surface of the terminal contacts the inner wall of the through-hole. As illustrated in FIG. 5, while the terminal 426 may have a square cross section having a member of W, the through-hole 432 of the casing 414 may have a square opening having a member of W1, which is equal to the member W of the terminal 426, thereby allowing the terminal 426 to be contacted with the through-hole 432. This also facilitates aligning the terminal 426 with the casing 414 and prevents leaking the insulating resin from the through-hole 432 even when the insulating resin has high flowability.

In addition, the through-hole 432 may be designed such that the cross section thereof is tapered as being away from the semiconductor device, i.e., tapered upwardly. The tapered through-hole 432 serves a function for guiding the terminal 426, facilitating insertion of the terminals therethrough.

Further, as shown in FIG. 1, the casing 14 preferably has the minimum depth D which allows the insulating resin member 34 to just cover the root 28 of the terminals 26. When the casing is structured so as to have the insulating resin member 34 fully encompassing the semiconductor device up to the main surface, more amount of the insulating resin is required. Thus, the depth D of the casing 14 is to be set so that the insulating resin member 34 covering the root of the terminal is prevented from overflowing when the gap is filled up with the insulating resin material.

Also, referring to FIG. 1, while an exposure side surface length S is defined where the side surface of the semiconductor device is exposed to the ambient atmosphere. The exposure side surface length S contributes the insulating creepage distance L2 as it is substantial, however, it would no longer give influence to the insulating creepage distance L2 when the exposure side surface length S is less than the minimum distance thereof. Therefore, the semiconductor module is preferably designed so that the exposure side surface length S is the minimum distance or greater to contribute the insulating creepage distance L2. In this situation, as shown in FIG. 1, when the radiator 16 contacting the main surface 20 is sized and shaped to oppose to the insulating resin member 34 between the casing 14 and the package 18 in order to improve the radiating efficiency, the exposure side surface length S can also contribute the insulating creepage distance L2. Also, unlike the structure of FIG. 1, if the radiator contacts only a portion of the main surface of the package (not shown) rather than the entire main surface, the distance of the exposed portion of the main surface and the exposure side surface length S may be counted for influencing the insulating creepage distance L2. Further, the exposure side surface length S may preferably be set to the minimum distance or greater to contribute the insulating creepage distance L2 for securing the insulating creepage distance of the semiconductor module.

Figure 6:
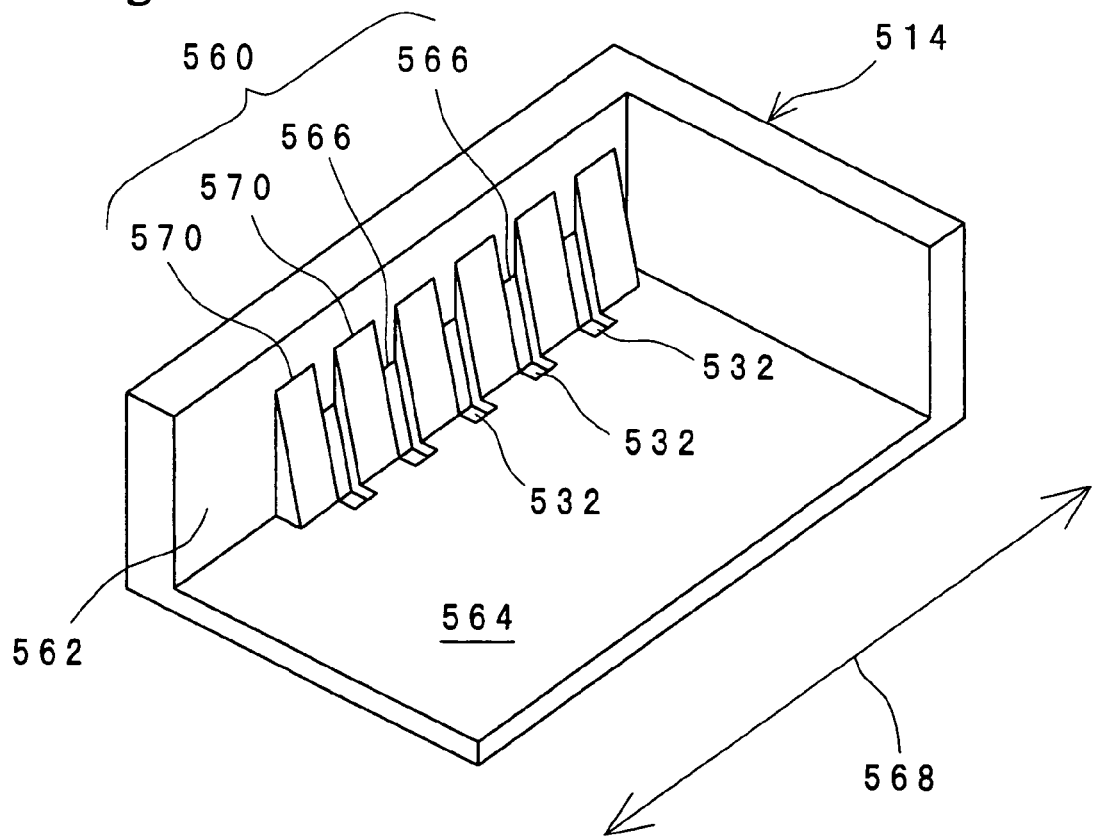
FIG. 6 is a perspective view of the casing illustrating the terminal guides.

In addition, the casing may have a guide member for guiding each of the terminals into the respective one of the through-holes. FIG. 6 is a perspective view of the casing 514 including the guide member 560. The casing 514 includes a vertical wall 562 opposing to the side surface of the package to be received, and a base member (bottom member) 564. The guide member includes a plurality of through-holes on the base member 564, a plurality of leading portions 566 each having an inclined surface formed between the vertical wall 562 and the base member 564 for leading the terminals into the through-holes, and a plurality of limiting portions 570 formed between adjacent two of the leading portions 566 each having a raised surface than the adjacent inclined surfaces. This facilitates insertion of the terminals into the through-holes when the semiconductor device is received within the casing.

Figure 7:
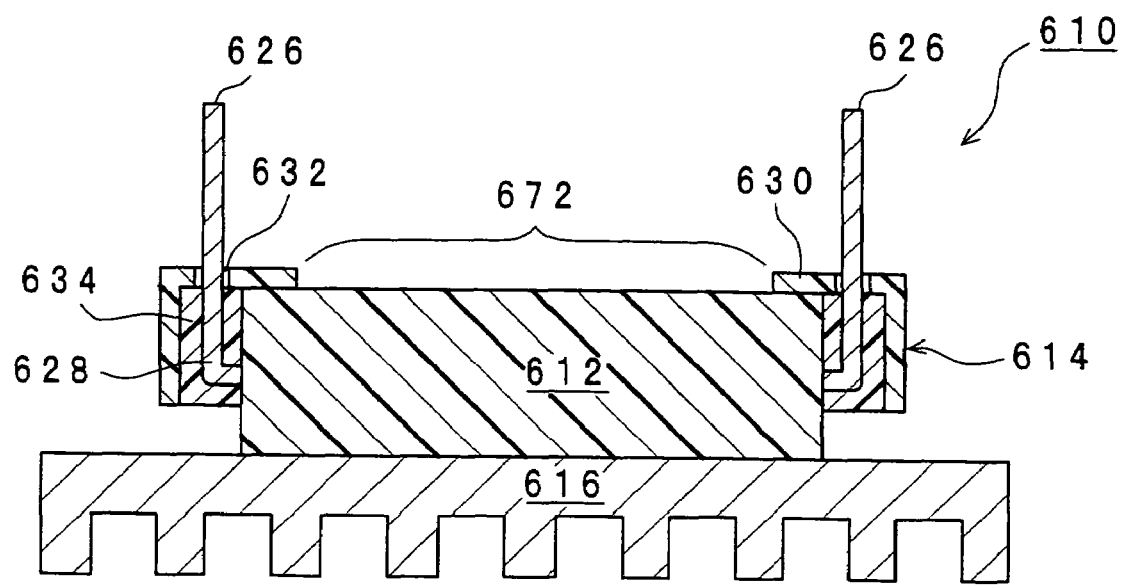
FIG. 7 is a cross sectional view of the modified semiconductor module.

Further, as illustrated in FIG. 7, the casing 614 may have an opening 672 in the base member 630, as long as the roots 628 of the terminals 626 are covered with the insulating resin member 634 and the terminals 626 exposed in part to the atmosphere are located away from the radiator 616 (i.e., the terminals extend towards the direction opposite to the radiator). This structure also sufficiently secures insulating clearance distance and insulating creepage distance. The opening 672 saves the material composing the casing 614.

What is claimed is:

1. A semiconductor module, comprising:
   at least one semiconductor device including a semiconductor element molded with a resin package having a main surface and a side surface, and a plurality of terminals extending from the side surface and being bent away from the main surface;
   a box-shaped hollow casing including a base member having a plurality of through-holes and an opening opposite to the base member configured to receive said at least one semiconductor device with the terminals of said at least one semiconductor device inserted into the through-holes;
   an insulating resin member filling up a gap between said at least one semiconductor device and said casing, and covering portions of the terminals at the side surface of the resin package of said at least one semiconductor device; and
   a circuit board connected to said at least one semiconductor device and received within said insulating resin member between said at least one semiconductor device and said casing,
   wherein the side surface of the resin package includes a first side portion in contact with the insulating resin member and a second side portion free of the insulating resin member, the second side portion extending from the insulating resin member to the main surface.

2. The semiconductor module according to claim 1, wherein said at least one semiconductor device includes a plurality of semiconductor devices, which are received in said casing with each of the terminals of said semiconductor devices inserted into the through-holes.

3. The semiconductor module according to claim 1, wherein one of the terminals of said at least one semiconductor device is electrically connected with another one of the terminals via a conductive connector formed within said insulating resin member.

4. The semiconductor module according to claim 2, wherein one of the terminals of said at least one semiconductor device is electrically connected with another one of the terminals via a conductive connector formed within said insulating resin member.

5. The semiconductor module according to claim 1, wherein said casing includes a terminal-block base forming a terminal block that contacts one of the terminals of said at least one semiconductor device.

6. The semiconductor module according to claim 1, wherein one of the through-holes of said casing contacts with at least a portion of one of the terminals of said at least one semiconductor device.

7. The semiconductor module according to claim 1, wherein one of the through-holes of said casing has a cross section tapered away from said at least one semiconductor device.

8. The semiconductor module according to claim 1, wherein one of the terminals of said at least one semiconductor device has a root fully covered with said insulating resin member.

9. The semiconductor module according to claim 1, wherein an exposure side surface length of the second side portion of the resin package that is exposed to the atmosphere contributes to an insulating creepage distance of the semiconductor module, including an exposed portion of the main surface.

10. The semiconductor module according to claim 1, wherein said casing includes a guide member configured to guide each of the terminals of said at least one semiconductor device into respective through-holes of said casing.

11. The semiconductor module according to claim 1, further comprising a radiator fixed onto the main surface of said at least one semiconductor device.

\* \* \* \* \*

UNITED STATES PATENT AND TRADEMARK OFFICE
CERTIFICATE OF CORRECTION

PATENT NO.       : 7,476,966 B2                                              Page 1 of 1
APPLICATION NO.  : 11/337465
DATED            : January 13, 2009
INVENTOR(S)      : Shinohara It is certified that error appears in the above-identified patent and that said Letters Patent is hereby corrected as shown below:

On the title page, Item (73), the Assignee should read:

--(73) Assignee:   Mitsubishi Denki Kabushiki Kaisha,
                   Tokyo (JP)--

Signed and Sealed this

Tenth Day of March, 2009

JOHN DOLL
*Acting Director of the United States Patent and Trademark Office*